United States Patent
Molloy et al.

[11] Patent Number: 6,046,115
[45] Date of Patent: *Apr. 4, 2000

[54] METHOD FOR REMOVING ETCHING RESIDUES AND CONTAMINANTS

[75] Inventors: Simon John Molloy; Daniel Joseph Vitkavage, both of Orlando, Fla.

[73] Assignee: Lucent Technologies Inc., Murray Hill, N.J.

[ * ] Notice: This patent is subject to a terminal disclaimer.

[21] Appl. No.: 09/164,283

[22] Filed: Oct. 1, 1998

Related U.S. Application Data

[63] Continuation of application No. 08/979,297, Nov. 26, 1997, Pat. No. 5,849,639.

[51] Int. Cl.[7] .................................... H01L 21/3065
[52] U.S. Cl. .................... 438/710; 438/725; 438/906; 134/1.2; 216/67; 430/329
[58] Field of Search .................. 438/714, 725, 438/906, 710; 134/1.2; 216/67; 430/328, 329, 331

[56] References Cited

U.S. PATENT DOCUMENTS

| | | | |
|---|---|---|---|
| 5,228,950 | 7/1993 | Webb et al. | 438/714 |
| 5,382,316 | 1/1995 | Hills et al. | 216/67 |
| 5,496,438 | 3/1996 | Wootton et al. | 216/58 |
| 5,514,247 | 5/1996 | Shan et al. | 438/700 |
| 5,670,019 | 9/1997 | Huang | 438/628 |
| 5,674,357 | 10/1997 | Sun et al. | 134/1.2 |
| 5,824,604 | 10/1998 | Bar-Gadda | 438/725 |
| 5,849,639 | 12/1998 | Molloy et al. | 438/714 |
| 5,882,489 | 3/1999 | Bersin et al. | 204/192.35 |

*Primary Examiner*—Benjamin L. Utech
*Assistant Examiner*—Donald L. Champagne

[57] ABSTRACT

A gas plasma process without argon sputtering for removing photoresist, etch residues and other contaminants involved in etching vias in integrated circuit devices is disclosed. The process involves placing the substrate having etched vias or contact holes in a suitable low bias reactor; applying to the substrate surface a mixture of gases at low bias selected from the group consisting of oxygen, nitrogen, fluorine, hydrofluorocarbon and fluorinated methane and amine gases to both remove the photoresist layer and alter the composition of the residues such that the residues are soluble in water; and rinsing the substrate with deionized water. The plasma process should be carried out at temperatures of less than about 100 degrees C. to avoid mobile ion contamination problems and oxidation of the etch residues.

20 Claims, 3 Drawing Sheets

6,046,115

METHOD FOR REMOVING ETCHING RESIDUES AND CONTAMINANTS

RELATED APPLICATIONS

This application is a continuation of U.S. patent application Ser. No. 08/979,297, filed Nov. 26, 1997, U.S. Pat. No. 5,849,639.

FIELD OF THE INVENTION

The present invention relates to a gas plasma process for removing photoresist and etching residues and contaminants and particularly those produced in etching vias in integrated circuit devices.

BACKGROUND OF THE INVENTION

Semiconductor integrated circuit devices typically comprise multiple layers of vertically stacked metal interconnect layers with dielectric materials disposed between them. As microelectronic circuits become increasingly integrated, the surface area for the circuits is being reduced with an increase in the number of vertically stacked metal interconnect layers. It is anticipated, for example, that chips having an area of one square centimeter could potentially have tens to hundreds of dense interconnect layers to effectively use all elements on the die. Thus, there is an increased need for improved methods of coupling interconnect layers.

Electrical connections between interconnect layers are achieved with contact holes and via holes placed in the dielectric layers as they are fabricated. A contact hole is a conduit for electrically connecting the metal layers to the semiconductor substrate, and a via hole is a conduit for electrically connecting two metal interconnect layers, which may be adjacent or distal layers. Typically, the contact and via holes are formed with etching techniques that require use of high temperatures and reactive solvents to strip the photoresist and remove other residues and mobile ion contaminants. There are drawbacks, however, with these processes.

For example, FIGS. 1A through 1G are diagrammatic cross-sectional views depicting exemplary processing steps involved in constructing an integrated circuit device with post contact and via holes. In FIG. 1A, there is shown a semiconductor substrate 10, having disposed thereon a plurality of transistors or diodes, shown generally as active regions 12. A first dielectric layer 14 is deposited over the substrate, which may be comprised of a thin film of silicon-dioxide, $SiO_2$, or other dielectric materials such as a-$Ta_2O_5$, a-$TiO_x$, or x-$(Ba,Sr)TiO_3$. An etch stop layer 16 comprised, for example, of silicon nitride, may be deposited over the dielectric layer. Contact holes 18 (shown in FIGS. 1C–1D) are formed in the device of FIG. 1A to provide contact with the active regions 12 of the substrate 10.

The etching of the device to form the contact holes 18 often is performed with a photoresist mask and dry etching process involving use of a plasma RIE process and a reactive gas, such as $CHF_3$ or $SF_6$. Referring to FIG. 1B, a photosensitive mask may be used to deposit a photoresist layer 20, over selected regions of the etch stop layer 16. The exposed portions of the etch stop layer 16 and dielectric layer 14 are controllably etched with the reactive etchant to expose the active regions 12 and provide contact holes 18 (FIG. 1C). However, referring to FIG. 1C, the photoresist layer 20 needs to be removed, that is, to provide the structure of FIG. 1D. The stripping of this layer 20 is generally performed at high temperature using an $O_2$-containing plasma, e.g., at about 250° C.

The high temperatures used to strip the photoresist introduces complications to the process, as the high temperatures may cause oxidation of the materials at the bottom of the contact or via holes (i.e. these materials may comprise silicon, titanium nitride, or aluminum). The photoresist process may cause mobile ion contaminants (i.e., Na+, Cl−, fluoride species, or other ionic organic compounds), to become embedded in the wafer surface (which usually is comprised of silicon dioxide [$SiO_2$]). These contaminants should be removed as they may cause electrical device or crystal defects, lower oxide breakdown fields, and overall degrade the performance and yield of the device. To remove the contaminants, often an isotropic oxide etch is performed (e.g., using a dry plasma process and gas mixtures of $CF_4/O_2$ or $NF_3/He$). Other methods may be used, such as cleaning with an HF acid solution. In any case, the high temperatures associated with the photoresist strip process introduce oxidation or mobile ion contamination problems which adversely impact upon product yield and reliability and require the use of additional processing steps.

Additionally, after the photoresist 20 is stripped, photoresist residues may remain, (e.g., on the surface of the etch stop layer 16), and the surface and sidewalls of the substrate at the contact or via holes 18 may contain etchant residues. These residues are often comprised of titanium and aluminum-containing films (non-volatile etch products) which frequently will adhere to the sidewalls of the contact or via holes. Thus, once the photoresist is stripped, the structure needs to be cleansed. This is typically done with a solution such as $H_2SO_4/H_2O_2$ or solutions commonly known in the trade as EKC-265 (a solution comprising hydroxyl amine, 2-(2-aminoethoxy)ethanol, cathechol, and an alkaline buffer), and ACT-CMI (a solution of dimethylacetamide and diethanol amine). A further oxide etch or cleansing step may then be performed to remove the mobile ion contamination and oxidized layers.

This photoresist and etching process may be continued to provide further via holes as the fabrication of the integrated circuit device is continued, and as each group of via holes are formed, the cleaning process is repeated. For example, FIG. 1E shows the contact holes 18 of FIG. 1D filled with a metal interconnect structure 26, providing an electrical connection to the active regions 12. On the interconnect structures 26 there is disposed a protective layer 28 and a dielectric layer 30. A photoresist layer 31 is shown deposited over selected regions of the dielectric layer 30, and the plasma etching process is performed to provide via holes 32 at the exposed regions, as shown in FIG. 1F. The photoresist layer 31 of FIG. 1F may then be removed to provide the structure of FIG. 1G. As previously discussed, the photoresist 31 is stripped at high temperatures, creating mobile ion contamination. A cleansing solution is applied to remove etchant or photoresist residue from the etched surface 30, and from the sidewall or top surface of the vias 32. A further oxide etch or cleansing step is then applied to address the mobile ion contamination. These processes may be continued as additional layers are applied, resulting in multiple interconnect regions provided through many via holes etched during fabrication, followed by many cleaning steps.

Although the etching process described above is advantageous for producing a multi-layered integrated circuit device with a plurality of interconnects, there are drawbacks associated with the photoresist strip and residue removal process. The use of high temperatures in the photoresist strip process is disadvantageous as it creates the potential for mobile ions being embedded in the substrate, requiring additional etching or cleaning steps. The solvents used in removing the residues create potential for solvent build-up and corrosion of the circuit device. As circuit devices are integrated and the surface area of the devices is reduced, the diameter of the vias is likewise reduced, which increases the likelihood that solvents will become trapped in the vias and increases the potential for corrosion. Each cleansing step increases the process time, and especially when a multi-tiered structure is being fabricated, each additional step can significantly increase the overall processing time. The use of reactive solvents also creates disposal issues and health concerns.

Accordingly, there is a need for improved methods of stripping photoresist layers and removing residues and contaminants involved in fabricating post vias in integrated circuits. This invention addresses these needs. Further advantages may appear more fully upon consideration description below.

SUMMARY OF THE INVENTION

Applicants have discovered that in fabricating vias and contact holes for an integrated circuit device, a gas plasma process may be applied to both remove a photoresist layer and alter the composition of etch residues such that the residues are soluble in water and may be rinsed with deionized water. The process involves placing the substrate having etched vias or contact holes in a reactor; applying to the substrate a mixture of gases selected from the group consisting of oxygen, nitrogen, fluorine, hydrofluorocarbon, fluorinated methane and amine gases; and rinsing the substrate with deionized water. The process may be carried out at temperatures of less than about 100 degrees Centigrade. Preferred gas mixtures comprise oxygen, nitrogen, and fluoromethane; oxygen, nitrogen, and tetrafluoromethane; and oxygen, trifluoroamine and tetrafluoromethane. Preferably, a remote plasma source reactor is used.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale.

DETAILED DESCRIPTION OF THE INVENTION

Applicants have discovered a new method for stripping photoresist and removing residues involved in fabricating integrated post vias and contact holes involving a gas plasma process and low temperatures (less than about 100 degrees Centigrade). With this process, the gas plasma both strips the photoresist and removes residues, while also altering the composition of the residues to be soluble in water, such that a deionized water rinse may be used. The process thus avoids the use of reactive cleaning solvents and problems associated with them, such as the potential for corrosion, reduced yield and reliability, and health and safety concerns. The use of low temperatures with this process further avoids difficulties relating to mobile ion contamination. The inventive method is also simplified as compared with previous photoresist strip and residue removal methods, reducing the overall processing time and increasing the efficiency and yield.

Figure 2:
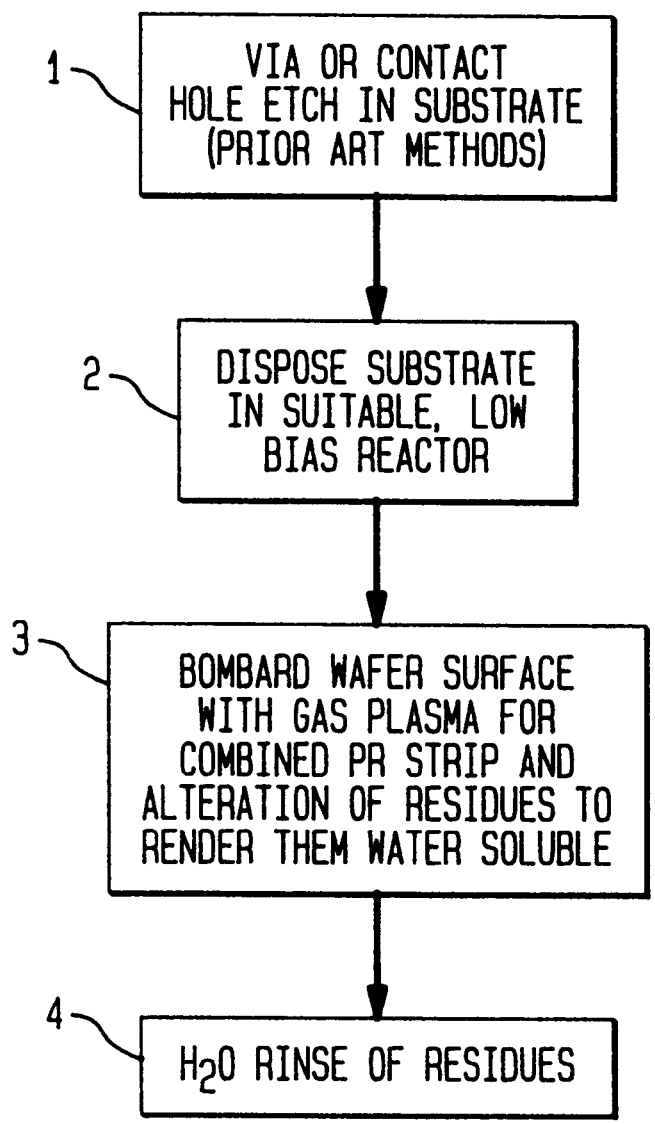
FIG. 2 is a block diagram of the steps of the inventive method.

For example, referring to FIG. 2, there is shown a block diagram of the steps of the inventive method. As can be seen from FIG. 2, there are few steps with this method, which should significantly decrease the processing time in fabricating integrated circuits with interconnect layers and via and contact holes. For example, argon sputtering or a combination of microwave and RIE processing steps are not required. The first step (FIG. 2, block 1) is to perform the via etch (or contact hole etch), applying methods known in the field, such as with a reactive gas mixture of $CHF_3$ or $SF_6$. The particular etching methods used are not critical to the invention, and any type of via or contact hole may be formed, such as a vertical or sloped via. The etch will likely involve use of a photoresist layer to be stripped.

Figure 1A:
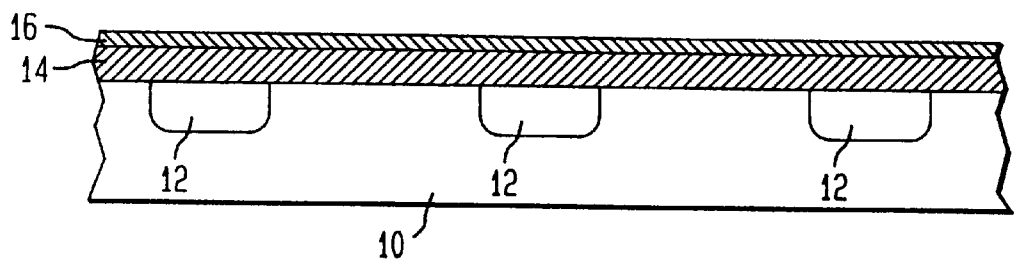
FIGS. 1A through 1G illustrate steps involved in fabricating via and contact holes in integrated circuit devices.
Figure 1B:
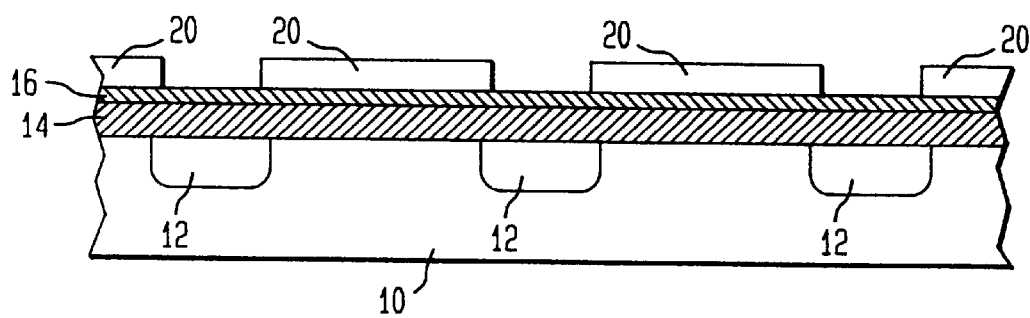
Figure 1C:
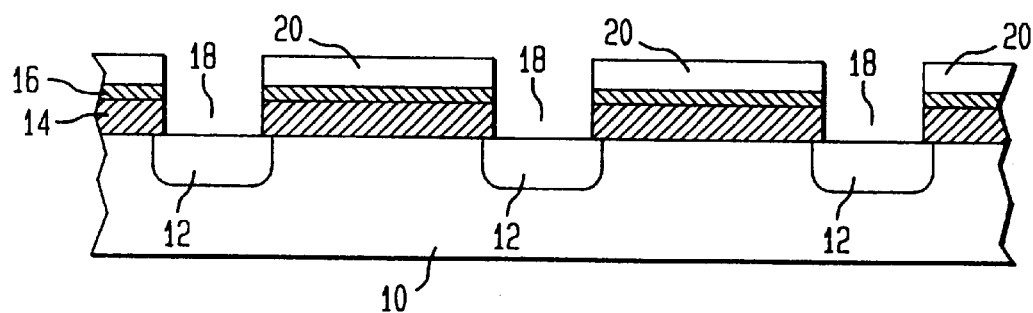
Figure 1D:
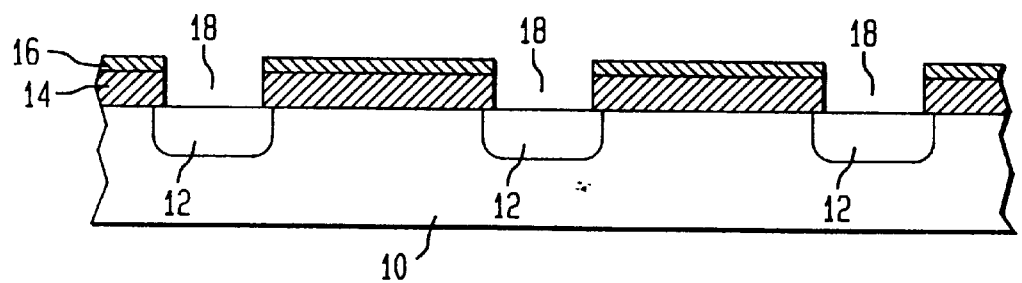

The next step (FIG. 2, block 2), is to dispose the substrate in a suitable reactor or vacuum chamber for application of the gas plasma. The substrate at this point may appear as reflected in FIG. 1C or 1F, that is, having the etched via and contact holes (18, 32) and photoresist layer (20, 31), to be stripped. The reactor may be a Remote Plasma Source (RPS) reactor available from Applied Materials, Inc., which is known in the field. Other reactors known in the field also may be used, such as downstream or plasma reactors; high density (inductively coupled) reactors; triode or other dual-powered types of reactors; upper power plasma reactors; and low power RIE plasma reactors. The reactor should be operated in a mode giving low wafer bias, which implies a maximum energy of about less than 50 electron Volts (eV) for ions striking the wafer surface, i.e., ion bombardment in the gas plasma process should be as gentle as possible. It has been found that an RPS reactor with an applied power of 1000 to 1500 W works well.

The next step (FIG. 2, block 3), is to produce a plasma with a low substrate bias voltage to bombard the wafer surface with a mixture of gases selected from the group consisting of oxygen, nitrogen, fluorine, hydrofluorocarbon, fluorinated methane, and amine gases. Preferred gas mixtures comprise oxygen, nitrogen, and fluoromethane; oxygen, nitrogen, and tetrafluoromethane; and oxygen, trifluoroamine and tetrafluoromethane. More particularly, the wafer is advantageously etched using gas mixtures comprising about (a) 150–250 sccm $O_2$, 100–200 sccm $N_2$, and 150–250 sccm $CH_3F$; (b) 800–1000 sccm $O_2$, 50–200 sccm $N_2$, and 10–30 sccm $CF_4$; (c) 900–1100 sccm $O_2$ and 20–40 sccm $NF_3$; and (d) 700–900 sccm $O_2$, 20–40 sccm $NF_3$, and 150–250 sccm $H_2O$ (vapor). (The unit "sccm" refers to standard cubic centimeters per minute, at standard pressure and temperature.) The $H_2O$ (vapor) of the latter mixture is a vapor added to the plasma and does not replace the subsequent $H_2O$ liquid rinse. Particularly preferred is use of gas mixtures comprising about (a) 200 sccm $O_2$, 150 sccm $N_2$, and 200 sccm $CH_3F$; (b) 970 sccm $O_2$, 100 sccm $N_2$, and 20 sccm $CF_4$; (c) 1000 sccm $O_2$ and 30 sccm $NF_3$; and (d) 800 sccm $O_2$, 30 sccm $NF_3$, and 200 sccm $H_2O$ (vapor). Again, the $H_2O$ (vapor) does not replace the $H_2O$ liquid rinse.

The gases strip the photoresist 25, 37, at a relatively high strip rate, while they also alter the composition of the residue from the etching process rendering the residues soluble in water and enabling their cleansing with an $H_2O$ rinse. The process is preferably performed at a temperature of less than about 100 degrees C. and more preferred is a temperature of 40 to 90 degrees Centigrade, with the ion bombardment being performed during a period of about 10 to 90 seconds.

Lastly, an $H_2O$ rinse (FIG. 2, block 4), is applied to remove the now water-soluble residues.

The invention will now be described with reference to an Example. However, it is understood that the Example is illustrative and not limiting in nature.

EXAMPLE 1

Figure 1E:
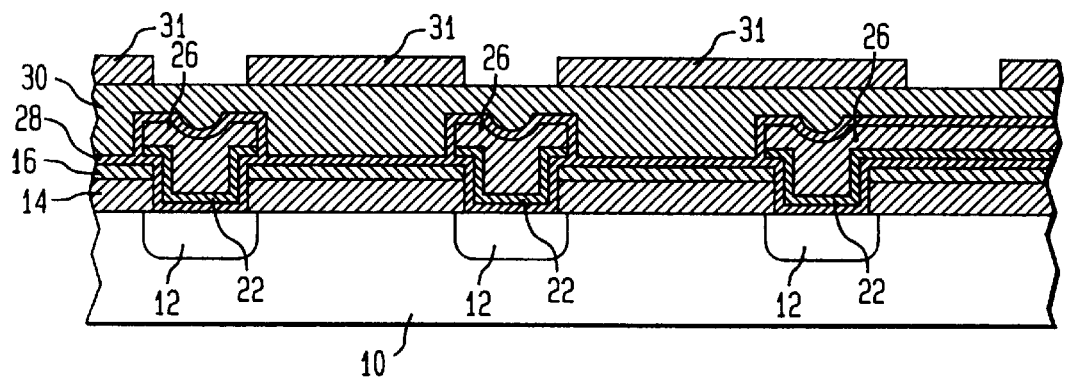
Figure 1F:
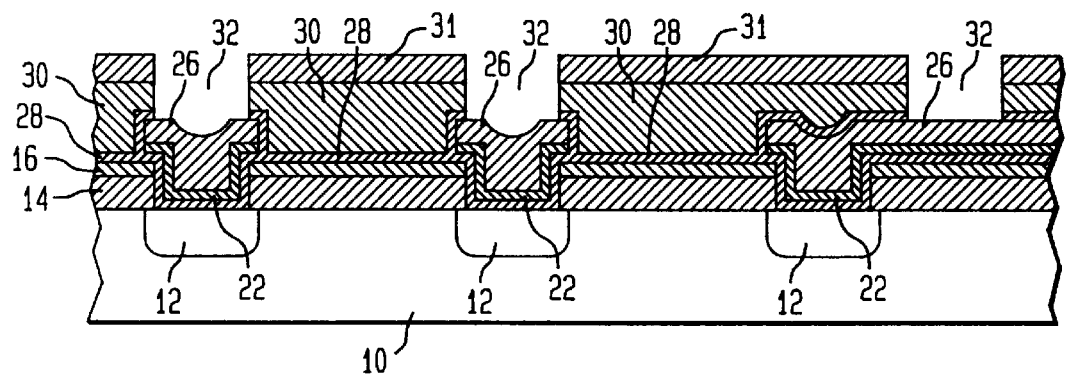
Figure 1G:
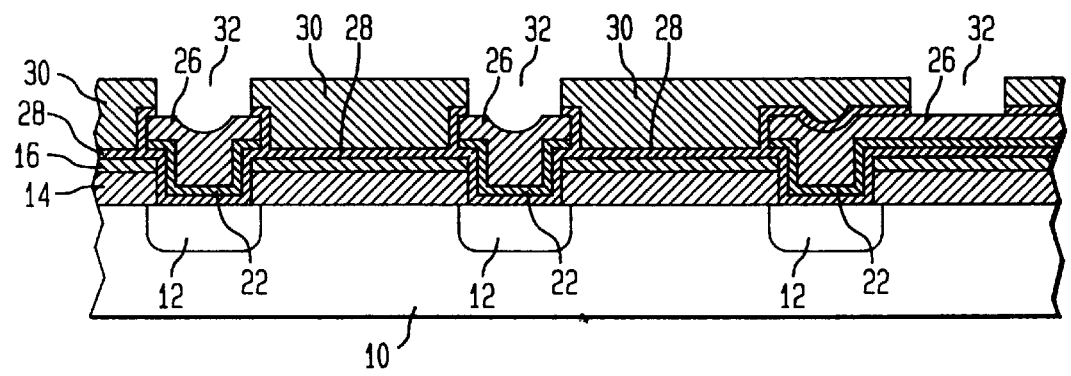

Referring to FIG. 1E, a photolithographic process is used to pattern a photosensitive polymer layer 31, over selected regions of the dielectric layer 30. The exposed portions of the dielectric layer 30 are controllably etched with an RIE plasma process and reactive etchant, following methods known in the art, to provide the structure of FIG. 1F. The structure of FIG. 1F is placed in an Applied Materials RPS reactor. The reactor pressure is set at 1.50 Torr. The substrate and particularly the via sidewalls are bombarded with a gas mixture comprised of oxygen, nitrogen, and hydrofluorocarbon gases, with a relative composition of 200 sccm $O_2$, 150 sccm $N_2$, and 200 sccm $CH_3F$. This gas mixture is applied over the substrate for about 60 seconds at 1000 W. The temperature is kept at or below 100 degrees C. at all times. This bombardment alters the composition of the residues to make them water soluble. Next, the pressure of the reactor is lowered to 0.7 Torr, and a gas mixture of about 1000 sccm $O_2$, 100 sccm $N_2$, and 20 sccm $CF_4$ is applied. This mixture is applied over the substrate surface for about 30 seconds at 1400 W which strips the photoresist layer (FIG. 1F, 31). It is advantageous at this point to remove the substrate from the reactor and rinse it with deionized $H_2O$. Depending on conditions such as the purity of the photoresist, it may be desirable to return the substrate to the reactor for removal of mobile Na+ions. In that case, the reactor pressure is altered to 1.00 Torr and a gas mixture comprised of about 230 sccm $O_2$, 60 sccm $NF_3$, and 400 sccm $CF_4$ is applied over the substrate for about 15 seconds at 1400 W.

It will be understood that the embodiments described herein are merely exemplary and that a person skilled in the art may make variations and modifications without departing from the spirit and scope of the invention. All such variations and modifications are intended to be included within the scope of the appended claims.

We claim:

1. A process for stripping photoresist and removing etch residue comprising:
    (a) providing an etched substrate having a photoresist layer and etchant residues;
    (b) disposing the substrate in a reactor for applying a gas plasma over the surface of the substrate; and
    (c) etching the surface of the substrate using a mixture of gases to remove the photoresist layer and alter the composition of the etchant residues so that the residues are soluble in water, the process being performed without an argon sputtering step.

2. The process of claim 1, further comprising the step of:
    (d) rinsing the substrate with deionized water.

3. The process of claim 1, wherein the gases are selected from the group of oxygen, nitrogen, fluorine, hydrofluorocarbon, fluorinated methane, and amine gases.

4. The process of claim 1, wherein the etched substrate has via or contact holes for coupling interconnect layers of an integrated circuit device.

5. The process of claim 1, wherein the reactor is a downstream or remote plasma reactor operated at less than about 1500 W.

6. The process of claim 1, wherein the step of etching the substrate surface comprises an ion bombardment of the substrate surface at an energy level of less than about 50 eV.

7. The process of claim 1, wherein the mixture of gases comprise a plurality of gas mixtures selected from the group of (a) oxygen, nitrogen, and fluoromethane; (b) oxygen, nitrogen, and tetrafluoromethane; (c) oxygen, trifluoroamine and tetrafluoromethane; (d) oxygen and trifluoroamine; and (d) oxygen, trifluoroamine, and $H_2O$ (vapor).

8. The process of claim 1, wherein the mixture of gases is selected from the group consisting of about (a) 150–250 sccm $O_2$, 100–200 sccm $N_2$, and 150–250 sccm $CH_3F$; (b) 800–1000 sccm $O_2$, 50–200 sccm $N_2$, and 10–30 sccm $CF_4$; (c) 900–1100 sccm $O_2$ and 20–40 sccm $NF_3$; and (d) 700–900 sccm $O_2$, 20–40 sccm $NF_3$, and 150–250 sccm $H_2O$ (vapor).

9. The process of claim 1, wherein the step of etching the surface of the substrate comprises applying a gas mixture of about 200 sccm $O_2$, 150 sccm $N_2$, and 200 sccm $CH_3F$ over the substrate for about 60 seconds at 1400 W and 1.0 Torr; applying a gas mixture of about 1000 sccm $O_2$, 100 sccm $N_2$, and 20 sccm $CF_4$ over the substrate for about 30 seconds at 1000 W at 0.7 Torr; and applying a gas mixture of about 230 sccm $O_2$, 60 sccm $NF_3$, and 400 sccm $CF_4$ over the substrate for about 15 seconds at 1400 W and 1.00 Torr.

10. A process for stripping photoresist and removing etch residue comprising:
    (a) providing an etched substrate having a photoresist layer and etchant residues including aluminum;
    (b) disposing the substrate in a reactor for applying a gas plasma over the surface of the substrate; and
    (c) etching the surface of the substrate using $CH_3F$ and at least one gas selected from the group consisting of hydrofluorocarbon, fluorine, fluorinated methane, and amine gases at a sufficiently low temperature such that the at least one gas reacts with the residues to form water-soluble fluorinated metals and the $CH_3F$ reacts with the residues to form trimethyl aluminum.

11. The method of claim 10 wherein the at least one gas comprises a mixture of gases including $N_2$ for reacting with the metals and making them soluble in water.

12. The improved method of claim 10, further comprising the step of
    (d) rinsing the substrate with deionized water.

13. The method of claim 10, wherein the gases are selected from the group of oxygen, nitrogen, fluorine, hydrofluorocarbon, fluorinated methane, and amine gases.

14. The method of claim 10, wherein the reactor is a downstream or remote plasma reactor operated at less than about 1500 W.

15. The method of claim 10, wherein the step of etching the substrate comprises an ion bombardment of the substrate surface at an energy level of less than about 50 eV.

16. The method of claim 10, wherein the mixture of gases comprise a plurality of gas mixtures selected from the groups consisting of (a) oxygen, nitrogen, and fluoromethane; (b) oxygen, nitrogen, and tetrafluoromethane; and (c) oxygen, trifluoroamine and tetrafluoromethane; (d) oxygen and trifluoroamine; and (d) oxygen, trifluoroamine, and $H_2O$ (vapor).

17. The method of claim 10, wherein the mixture of gases is selected from the group consisting of about (a) 150–250 sccm $O_2$, 100–200 sccm $N_2$, and 150–250 sccm $CH_3F$; (b) 800–1000 sccm $O_2$, 50–200 sccm $N_2$ and 10–30 sccm $CF_4$; (c) 900–1100 sccm $O_2$ and 20–40 sccm $NF_3$; and (d) 700–900 sccm $O_2$, 20–40 sccm $NF_3$, and 150–250 sccm $H_2O$ (vapor).

18. The method of claim 10, wherein the step of etching the surface of the substrate comprises applying a gas mixture of about 200 sccm $O_2$, 150 sccm $N_2$, and 200 sccm $CH_3F$ over the substrate for about 60 seconds at 1000 W and 1.0 Torr; and applying a gas mixture of about 1000 sccm $O_2$, 100 sccm $N_2$, and 20 sccm $CF_4$ over the substrate for about 30 seconds at 1000 W at 0.7 Torr.

19. The method of claim 18, further comprising applying a third gas mixture of about 230 sccm $O_2$, 60 sccm $NF_3$, and 400 sccm $CF_4$ over the substrate for about 15 seconds at 1400 W and 1.00 Torr.

20. A process for stripping photoresist and removing etch residue comprising:

(a) providing an etched substrate having a photoresist layer and etchant residues including residues containing Al or Ti;

(b) disposing the substrate in a reactor for applying a gas plasma over the surface of the substrate;

(c) etching the surface of the substrate using a mixture of gases comprising $CH_3F$ and at least one gas selected from the group consisting of $O_2$, $N_2$, $CF_4$, $NF_3$, and $H_2O$ and ion bombardment is performed with a maximum energy of about less than 50 electron Volts at a sufficiently low temperature such that the gases react with the Al or Ti-containing residues to form water-soluble fluorinated metals and a methyl-aluminum compound.

* * * * *